(12) United States Patent
Lee

(10) Patent No.: US 10,776,199 B2
(45) Date of Patent: Sep. 15, 2020

(54) MEMORY SYSTEM AND OPERATING METHOD THEREOF

(71) Applicant: SK hynix Inc., Gyeonggi-do (KR)

(72) Inventor: Jun-Seo Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 234 days.

(21) Appl. No.: 15/879,512

(22) Filed: Jan. 25, 2018

(65) Prior Publication Data

US 2019/0004895 A1   Jan. 3, 2019

(30) Foreign Application Priority Data

Jul. 3, 2017   (KR) .......................... 10-2017-0084230

(51) Int. Cl.
  *G06F 11/10*   (2006.01)
  *G11C 13/00*   (2006.01)
  (Continued)

(52) U.S. Cl.
  CPC .......... *G06F 11/1044* (2013.01); *G06F 3/064* (2013.01); *G06F 3/0679* (2013.01);
  (Continued)

(58) Field of Classification Search
  CPC .... G06F 11/1044; G06F 3/064; G06F 3/0679; G06F 11/1048; G06F 11/108;
  (Continued)

(56) References Cited

U.S. PATENT DOCUMENTS

| | | | |
|---|---|---|---|
| 7,275,201 B1 * | 9/2007 | Porat .................... | G06F 11/1044 714/767 |
| 7,404,118 B1 * | 7/2008 | Baguette ............. | G06F 11/1044 714/723 |

(Continued)

FOREIGN PATENT DOCUMENTS

KR   1020140113101   9/2014

OTHER PUBLICATIONS

Awad et al., Non-volatile memory host controller interface performance analysis in high-performance I/O systems, IEEE , Conference Paper, pertinent pp. 145-154 (Year: 2015).*

*Primary Examiner* — April Y Blair
*Assistant Examiner* — Dipakkumar B Gandhi
(74) *Attorney, Agent, or Firm* — IP & T Group LLP

(57) ABSTRACT

The memory system includes a memory device including a volatile storage area and a non-volatile storage area; and a controller including first and second interfaces for transferring data between the memory system and a host, and suitable for transferring data between the volatile storage area and the host through the first interface and transferring data between the non-volatile storage area and the host through the second interface, wherein the controller is further suitable for determining whether or not an error occurs in data read from the volatile storage area in a normal operation mode, and dumping a whole of the volatile storage area into a predetermined first location of the non-volatile storage area when an error is determined to occur in the data read from the volatile storage area.

21 Claims, 10 Drawing Sheets

(51) Int. Cl.
*G06F 12/02* (2006.01)
*G06F 3/06* (2006.01)
*G11C 14/00* (2006.01)
*G11C 11/00* (2006.01)
G06F 11/22 (2006.01)
H03M 13/25 (2006.01)
H03M 13/15 (2006.01)
G06F 1/06 (2006.01)
G11C 16/04 (2006.01)

(52) U.S. Cl.
CPC ........ *G06F 11/108* (2013.01); *G06F 11/1048* (2013.01); *G06F 12/0246* (2013.01); *G11C 11/005* (2013.01); *G11C 13/004* (2013.01); *G11C 13/0069* (2013.01); *G11C 14/0045* (2013.01); *G06F 1/06* (2013.01); *G06F 2212/2022* (2013.01); *G06F 2212/7209* (2013.01); *G11C 16/0483* (2013.01); *H03M 13/152* (2013.01); *H03M 13/1515* (2013.01); *H03M 13/255* (2013.01); *H03M 13/258* (2013.01)

(58) Field of Classification Search
CPC ................... G06F 12/0246; G06F 1/06; G06F 2212/2022; G06F 2212/7209; G11C 11/005; G11C 13/004; G11C 13/0069; G11C 14/0045; G11C 16/0483; H03M 13/1515; H03M 13/152; H03M 13/255; H03M 13/258
See application file for complete search history.

(56) References Cited

U.S. PATENT DOCUMENTS

| | | | | |
|---|---|---|---|---|
| 2008/0082773 | A1* | 4/2008 | Tomlin | G06F 12/023 711/170 |
| 2011/0041039 | A1* | 2/2011 | Harari | G11C 29/76 714/773 |
| 2011/0258373 | A1* | 10/2011 | Miura | G11C 7/20 711/103 |
| 2012/0210108 | A1* | 8/2012 | Ishizuka | G11C 11/005 712/245 |
| 2013/0282957 | A1* | 10/2013 | Mylly | G06F 3/0679 711/103 |
| 2014/0281148 | A1* | 9/2014 | Ichida | G06F 1/3275 711/103 |
| 2015/0254003 | A1 | 9/2015 | Lee et al. | |
| 2015/0255130 | A1 | 9/2015 | Lee et al. | |
| 2015/0309886 | A1* | 10/2015 | Tsai | G06F 11/1469 714/19 |
| 2018/0052724 | A1 | 2/2018 | Lee | |

* cited by examiner

MEMORY SYSTEM AND OPERATING METHOD THEREOF

CROSS-REFERENCE TO RELATED APPLICATIONS

The present application claims priority to Korean Patent Application No. 10-2017-0084230, filed on Jul. 3, 2017, which is incorporated herein by reference in its entirety.

BACKGROUND

1. Field

Exemplary embodiments of the present invention generally relate to a memory system. Particularly, exemplary embodiments relate to a memory system and operating method thereof.

2. Description of the Related Art

The paradigm for computing environments is shifting toward ubiquitous computing which allows users to use computer systems anytime anywhere. For this reason, the demands for portable electronic devices, such as mobile phones, digital cameras and laptop computers are soaring. Those electronic devices generally include a memory system using a memory device as a data storage device. The data storage device may be used as a main memory unit or an auxiliary memory unit of an electronic device.

Since the data storage device using a memory device does not have a mechanical driving unit, it may have excellent stability and durability. Also, the data storage device has a quick data access rate with low power consumption. Non-limiting examples of the data storage device having such advantages include Universal Serial Bus (USB) memory devices, memory cards of diverse interfaces, Solid-State Drives (SSD), and the like.

SUMMARY

Embodiments of the present invention are directed to a memory system capable of effectively recovering data errors and a method for operating the memory system.

In accordance with an embodiment of the present invention, a memory system may include: a memory device including a volatile storage area and a non-volatile storage area; and a controller including first and second interfaces for transferring data between the memory system and a host, and suitable for transferring data between the volatile storage area and the host through the first interface and transferring data between the non-volatile storage area and the host through the second interface, wherein the controller is further suitable for determining whether or not an error occurs in data read from the volatile storage area in a normal operation mode, and dumping a whole data of the volatile storage area into a predetermined first location of the non-volatile storage area when an error is determined to occur in the data read from the volatile storage area.

Preferably, the controller is further suitable for determining whether or not an error occurs in data read from the non-volatile storage area in the normal operation mode, and copying the data including the error into a predetermined second location of the volatile storage area when the error is determined to occur in the data read from the non-volatile storage area.

Preferably, the controller includes: an error detection unit suitable for detecting whether or not an error occurs in data read from the non-volatile storage area and data read from the volatile storage area in the normal operation mode; and an operation control unit suitable for dumping the whole data of the volatile storage area into the predetermined first location of the non-volatile storage area or copying the data including the error into the predetermined second location of the volatile storage area in response to a detection signal provided from the error detection unit.

Preferably, the operation control unit is further suitable for letting the memory system enter an error analysis mode in response to a request provided from the host after the dumping of the whole data of the volatile storage area into the predetermined first location of the non-volatile storage area, and wherein the operation control unit is further suitable for letting the memory system enter the error analysis mode in response to a request provided from the host after the copying of the data including the error into the predetermined second location of the volatile storage area.

Preferably, the operation control unit is further suitable for, in response to a request provided from the host, in the error analysis mode: outputting the data of the predetermined first location to the host through the second interface; or dumping a whole data of the predetermined first location into the volatile storage area, and outputting a whole data of the volatile storage area to the host through the first interface; or outputting a whole data of the volatile storage area to the host through the first interface.

Preferably, the operation control unit is further suitable for, in response to a request provided from the host, in the error analysis mode: outputting the data of the predetermined second location to the host through the first interface; or copying the data of the predetermined second location into a predetermined third location of the non-volatile storage area and outputting the data of the predetermined third location to the host through the second interface.

Preferably, a size of the non-volatile storage area is greater than a size of the volatile storage area, a size of the predetermined first location is the same as the size of the volatile storage area, and a size of the predetermined second location is the same as a maximum size of data transferred to and/or from the non-volatile storage area at one time.

Preferably, the controller further includes: a clock generation unit suitable for generating a first clock having a relatively high frequency and a second clock having a relatively low frequency; and an operation control unit suitable for transferring data between the volatile storage area and the host through the first interface, which is operative in response to the first clock, and transferring data between the non-volatile storage area and the host through the second interface, which is operative in response to the second clock.

Preferably, the volatile storage area is a main memory of the host, and wherein the non-volatile storage area is a storage of the host.

Preferably, the first interface is an interface between either a dual in-line memory module (DIMM) interface or a peripheral component interconnect express (PCI-e) interface, and wherein the second interface is an interface between either a dual in-line memory module (DIMM) interface or a peripheral component interconnect express (PCI-e) interface.

Preferably, the memory device includes a plurality of volatile memory dies corresponding to the volatile storage area, and a plurality of non-volatile memory dies corresponding to the non-volatile storage area.

In accordance with an embodiment of the present invention, a operating method of a memory system including a memory device including a volatile storage area and a non-volatile storage area and first and second interfaces for transferring data between the memory system and a host, the operating method comprising: transferring data between the volatile storage area and the host through the first interface and transferring data between the non-volatile storage area and the host through the second interface; and determining whether or not an error occurs in data read from the volatile storage area in a normal operation mode, and dumping a whole data of the volatile storage area into a predetermined first location of the non-volatile storage area when an error is determined to occur in data read from the volatile storage area.

Preferably, the operating method further comprising determining whether or not an error occurs in data read from the non-volatile storage area in the normal operation mode, and copying the data including the error into a predetermined second location of the volatile storage area when the error is determined to occur in the data read from the non-volatile storage area.

Preferably, the operating method further comprising: letting the memory system enter an error analysis mode in response to a request provided from the host after the dumping of the whole data of the volatile storage area into the predetermined first location of the non-volatile storage area; and letting the memory system enter the error analysis mode in response to a request provided from the host after the copying of the data including the error into the predetermined second location of the volatile storage area.

Preferably, the operating method further comprising, in the error analysis mode: outputting the data of the predetermined first location to the host through the second interface; or dumping a whole data of the predetermined first location into the volatile storage area, and outputting a whole data of data of the volatile storage area to the host through the first interface; or outputting a whole data of data of the volatile storage area to the host through the first interface.

Preferably, the operating method further comprising, in the error analysis mode: outputting the data of the predetermined second location to the host through the first interface; or copying the data of the predetermined second location into a predetermined third location of the non-volatile storage area and outputting the data of the predetermined third location to the host through the second interface.

Preferably, a size of the non-volatile storage area is greater than a size of the volatile storage area, a size of the predetermined first location is the same as the size of the volatile storage area, and a size of the predetermined second location is the same as a maximum size of data transferred to and/or from the non-volatile storage area at one time.

Preferably, the transferring of the data includes: generating a first clock having a relatively high frequency and a second clock having a relatively low frequency; and transferring data between the volatile storage area and the host through the first interface, which is operative in response to the first clock; and transferring data between the non-volatile storage area and the host through the second interface, which is operative in response to the second clock.

Preferably, the volatile storage area is a main memory of the host, and wherein the non-volatile storage area is a storage of the host.

Preferably, the first interface is an interface between either a dual in-line memory module (DIMM) interface or a peripheral component interconnect express (PCI-e) interface, and wherein the second interface is an interface between either a dual in-line memory module (DIMM) interface or a peripheral component interconnect express (PCI-e) interface.

In accordance with an embodiment of the present invention, a memory system comprising: a memory device including first and second memories; and a controller suitable for transferring data from the first memory to an external through a first path with a greater speed, transferring data from the second memory to the external through a second path with a slower speed, and controlling the memory device: to dump, when detecting first data including an error from the first memory, whole data stored in the first memory into the second memory; and to copy, when detecting second data including an error from the second memory, the second data into the first memory.

DETAILED DESCRIPTION

Figure 1:
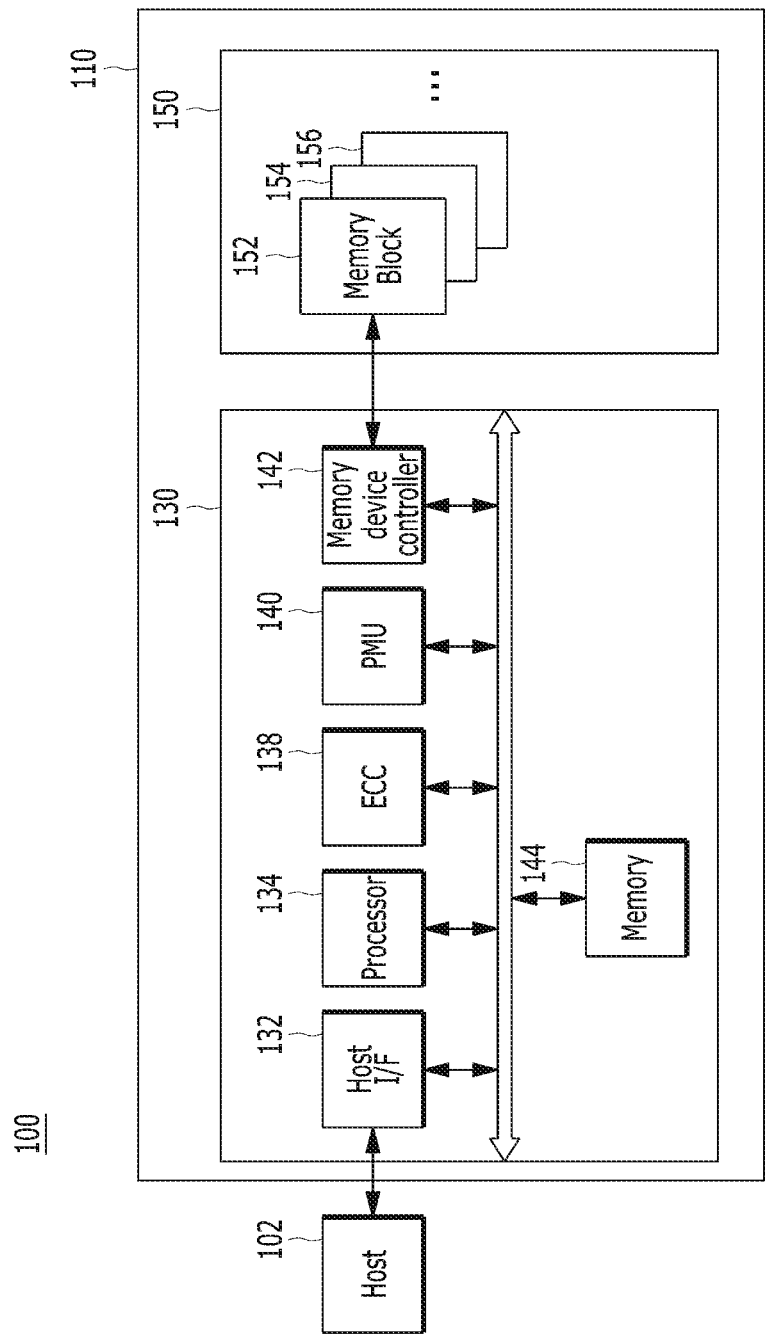
FIG. 1 is a block diagram illustrating a data processing system including a memory system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include, for example, a portable electronic device such as a mobile phone, an MP3 player, and a laptop computer or an electronic device such as a desktop computer, a game player, a TV, a projector, and the like.

The memory system 110 may operate in response to a request from the host 102, and in particular, store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Examples of suitable storage devices include a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such as a dynamic random access memory (DRAM) and a static RAM (SRAM) and nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM), and a flash memory.

The memory system 110 may include a memory device 150 which stores data to be accessed by the host 102, and a controller 130 which may control storage of data in the memory device 150.

The controller 130 and the memory device 150 may be integrated into a single semiconductor device, which may be included in the various types of memory systems as exemplified above.

The memory system 110 may be configured as part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3D television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various component elements configuring a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory blocks 152 to 156, each of the memory blocks 152 to 156 may include a plurality of pages. Each of the pages may include a plurality of memory cells to which a plurality of word lines (WL) are electrically coupled.

The controller 130 may control overall operations of the memory device 150, such as read, write, program, and erase operations. For example, the controller 130 of the memory system 110 may control the memory device 150 in response to a request from the host 102. The controller 130 may provide the data read from the memory device 150, to the host 102, and/or may store the data provided from the host 102 into the memory device 150.

The controller 130 may include a host interface (I/F) unit 132, a processor 134, an error correction code (ECC) unit 138, a power management unit (PMU) 140, a memory device controller 142 such as a NAND flash controller (NFC), and a memory 144 all operatively coupled via an internal bus.

The host interface unit 132 may process commands and data provided from the host 102, and may communicate with the host 102 through at least one of various interface protocols such as universal serial bus (USB), multimedia card (MMC), peripheral component interconnect-express (PCI-E), small computer system interface (SCSI), serial-attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, modules, systems or devices for the error correction operation.

The PMU 140 may provide and manage power of the controller 130.

The memory device controller 142 may serve as a memory/storage interface between the controller 130 and the memory device 150 to allow the controller 130 to control the memory device 150 in response to a request from the host 102. The memory device controller 142 may generate a control signal for the memory device 150 and process data to be provided to the memory device 150 under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be implemented with a volatile memory. The memory 144 may be implemented with a static random access memory (SRAM) or a dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 may control the overall operations of the memory system 110. The processor 134 may drive firmware, which is referred to as a flash translation layer (FTL), to control the general operations of the memory system 110.

A FTL may perform an operation as an interface between the host 102 and the memory device 150. The host 102 may request to the memory device 150 write and read operations through the FTL.

The FTL may manage operations of address mapping, garbage collection, wear-leveling and so forth. Particularly, the FTL may store map data. Therefore, the controller 130 may map a logical address, which is provided from the host 102, to a physical address of the memory device 150 through the map data. The memory device 150 may perform an operation like a general device because of the address mapping operation. Also, through the address mapping operation based on the map data, when the controller 130 updates data of a particular page, the controller 130 may program new data into another empty page and may invalidate old data of the particular page due to a characteristic of a flash memory device. Further, the controller 130 may store map data of the new data into the FTL.

The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is required.

Figure 2:
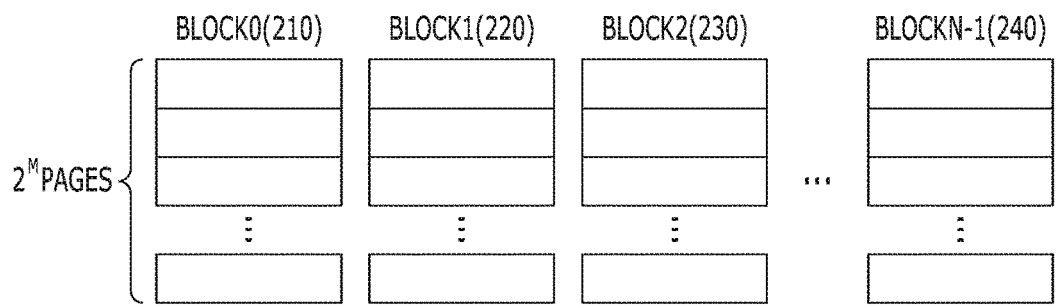
FIG. 2 is a schematic diagram illustrating an exemplary configuration of a memory device employed in the memory system of FIG. 1.

FIG. 2 is a schematic diagram illustrating the memory device 150.

Referring to FIG. 2, the memory device 150 may include the plurality of memory blocks BLOCK 0 to BLOCKN−1, and each of the blocks BLOCK 0 to BLOCKN−1 may include a plurality of pages, for example, $2^M$ pages, the number of which may vary according to circuit design. The memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Figure 3:
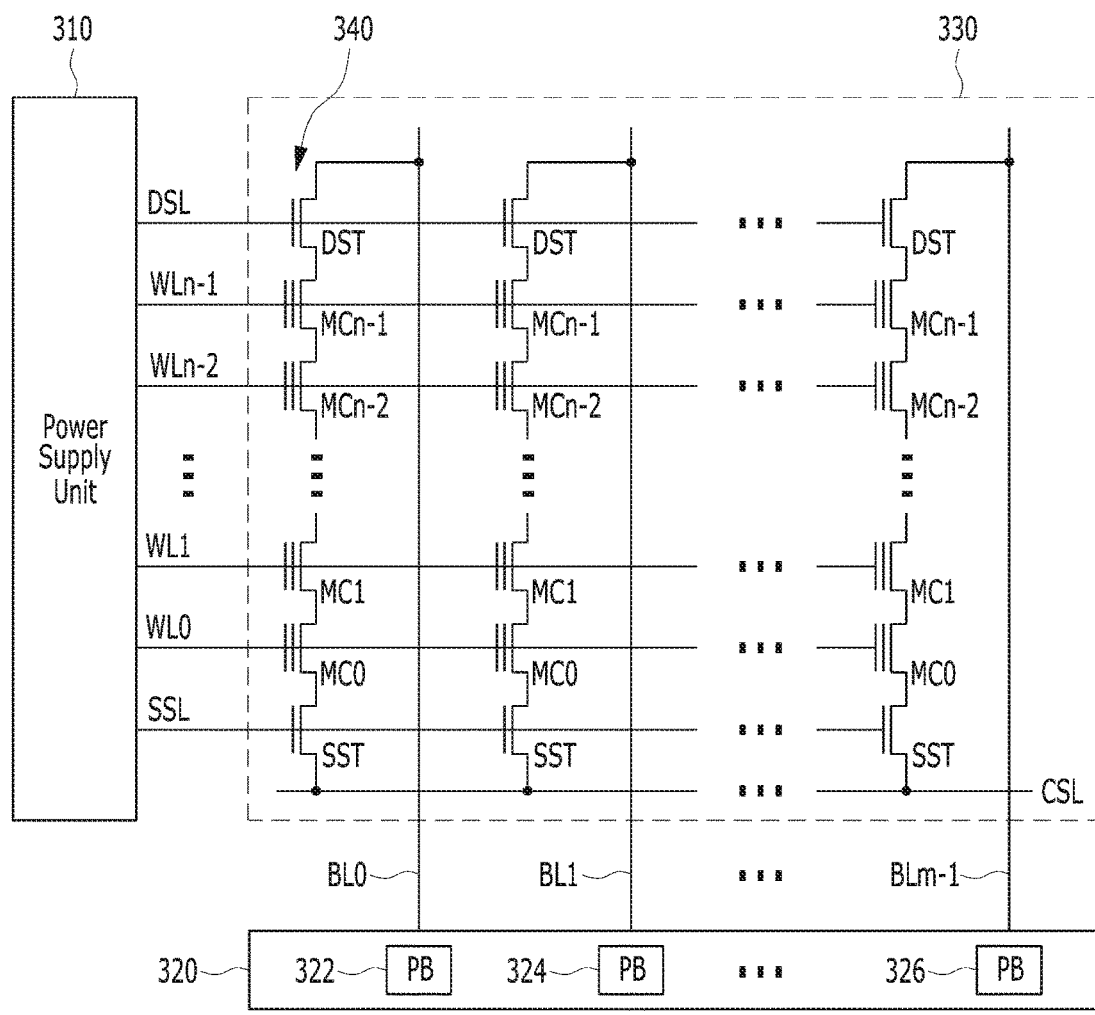
FIG. 3 is a circuit diagram illustrating an exemplary configuration of a memory cell array of a memory block in the memory device of FIG. 2.

FIG. 3 is a circuit diagram illustrating a memory block 330 in the memory device 150. For example, the memory block 330 may correspond to any of the plurality of memory blocks 152 to 156 shown in FIG. 1.

Referring to FIG. 3, the memory block 330 of the memory device 150 may include a plurality of cell strings 340, which are electrically coupled to bit lines BL0 to BLm−1. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by single level cells (SLC) each of which may store 1 bit of information, or by multi-level cells (MLC) each of which may store data information of a plurality of bits. For reference, in FIG. 3, 'DSL' denotes a drain select line, 'SSL' denotes a source select line, and 'CSL' denotes a common source line.

While FIG. 3 only shows, as an example, the memory block 330 which is configured by NAND flash memory cells, it is to be noted that the memory block 152 of the memory device 150 according to the embodiment is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A power supply unit 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The power supply unit 310 may perform a voltage generating operation under the control of a control circuit (not shown). The power supply unit 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
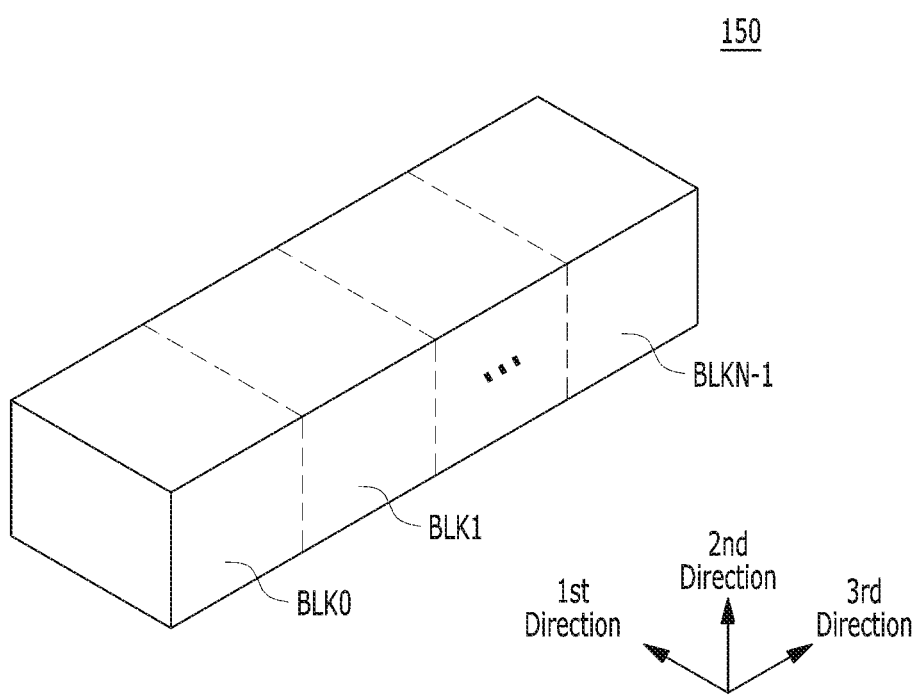
FIG. 4 is a schematic diagram illustrating an exemplary three-dimensional structure of the memory device of FIG. 2.

FIG. 4 is a schematic diagram illustrating a three-dimensional (3D) structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

Figure 5A:
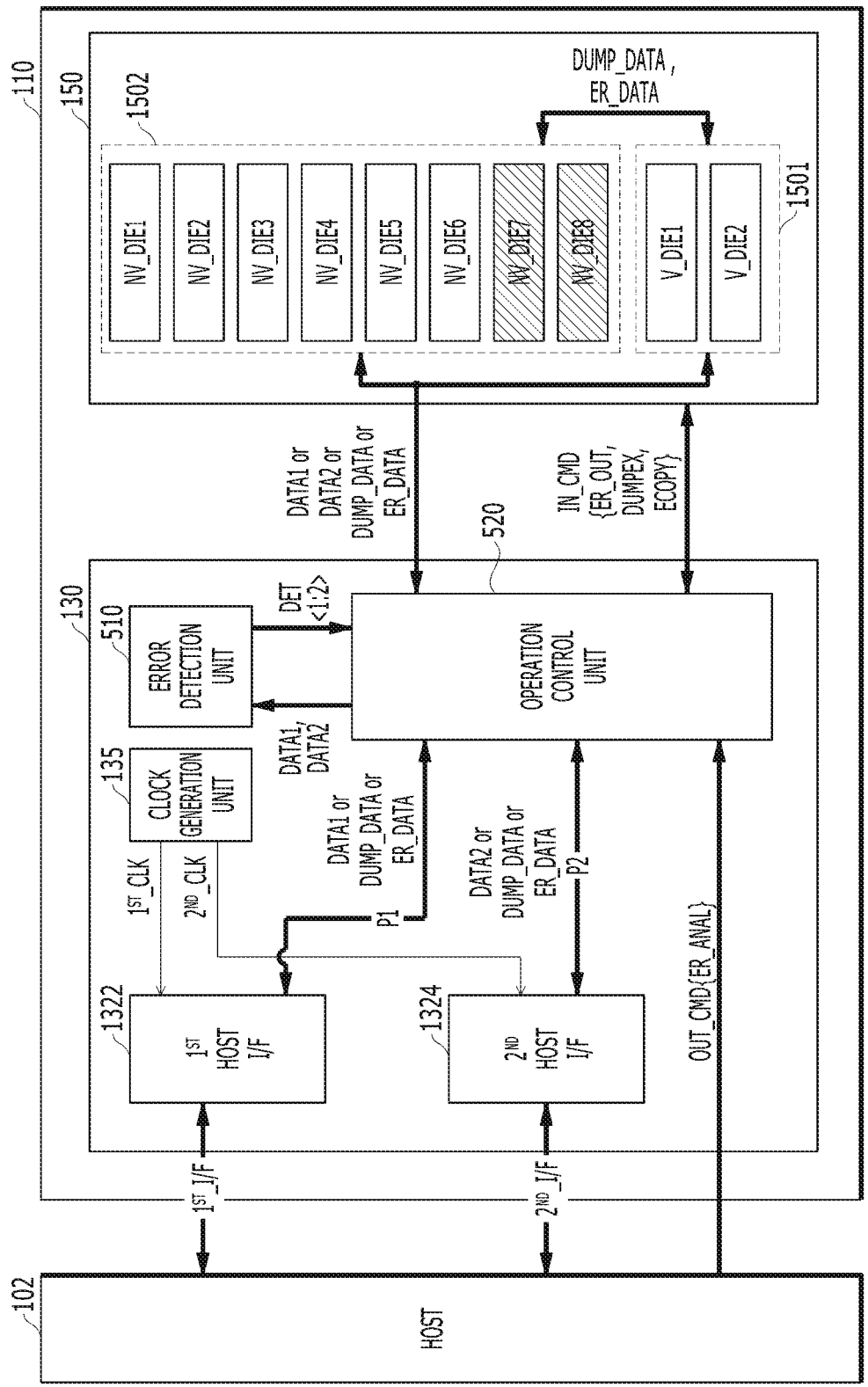
FIG. 5A is a block diagram illustrating a memory system in accordance with an embodiment of the present invention.

FIG. 5A is a block diagram illustrating the memory system 110 in accordance with an embodiment of the present invention.

Referring to FIG. 5A, the memory system 110 may include the memory device 150 of FIG. 1. Although FIG. 5A shows a single memory device 150 included in the memory system 110, it is to be noted that the present disclosure is not limited thereto. That is, a plurality of memory devices may be included in the memory system 110.

Furthermore, it is noted that elements 1322, 1324, 135, 500, 510, and 520 included in the controller 130 of FIG. 5A do not correspond to the elements 132, 134, 138, 140, and 142 included in the controller 130 of FIG. 1. This is because FIG. 5A shows functional elements 1322, 1324, 135, 510, and 520 of the controller 130 while FIG. 1 shows physical elements 132, 134, 138, 140, and 142 of the controller 130. That is, FIG. 5A shows the controller 130 not physically but functionally. Therefore, the controller 130 of FIG. 5A may be physically the same as the controller 130 of FIG. 1 and may include the physical elements 132, 134, 138, 140, and 142 included in the controller 130 of FIG. 1.

The difference between the controller 130 of FIG. 1 and the controller 130 of FIG. 5A is that the controller 130 of FIG. 1 may have only a single host interface 132, through which the controller 130 of FIG. 1 is coupled to the host 102, and while the controller 130 of FIG. 5A may have two interfaces 1322 and 1324, through which the controller 130 of FIG. 5A is coupled to the host 102.

To summarize, the memory system 110 of FIG. 1 and the memory system 110 of FIG. 5A may be the same as each other except that the memory system 110 of FIG. 5A may have two different interfaces 1322 and 1324 coupling the memory system 110 of FIG. 5A to the host 102.

The memory system 110 of FIG. 5A may include the memory device 150 and the controller 130. The memory device 150 may include a volatile storage area 1501 and a non-volatile storage area 1502. Particularly, the memory device 150 may include a plurality of memory dies NV_DIE<1:8> and V_DIE<1:2>. In the plurality of memory dies NV_DIE<1:8> and V_DIE<1:2>, a predetermined number of non-volatile memory dies NV_DIE<1:8> may be provided in the non-volatile storage area 1502 and a predetermined number of volatile memory dies V_DIE<1:2> may be provided in the volatile storage area 1501.

For example, the non-volatile memory dies NV_DIE<1:8> may comprise one or more of a flash memory device, a phase change random access memory (PCRAM) device, a resistive random access memory (RRAM) device, a ferroelectrics random access memory (FRAM) device, and a spin transfer torque random access memory (STT-MRAM) device, but are not be limited thereto. Also, the volatile memory dies V_DIE<1:2> may comprise one or more of a DRAM device and a SRAM device, but are not be limited thereto.

the controller 130 may include a first host interface 1322, a second host interface 1324, an operation control unit 520, a clock generation unit 135, and an error detection unit 510. In an embodiment, the first and second interfaces 1322 and 1324 and the clock generation unit 135 of FIG. 5A may correspond to the host interface unit 132 of FIG. 1, the error detection unit 510 of FIG. 5A may correspond to the ECC unit 138 of FIG. 1, and the operation control unit 520 of FIG. 5A may correspond to the processor 134 of FIG. 1.

The controller 130 may transfer data DATA1 or DUMP_DATA or ER_DATA between the volatile storage area 1501 and the host 102 through the first interface 1322, and may transfer data DATA2 or DUMP_DATA or ER_DATA between the non-volatile storage area 1502 and the host 102 through the second interface 1324.

The controller 130 may determine whether or not an error occurs in data DATA1 read from the volatile storage area 1501 in a normal operation mode. When an error is determined to occur in data DATA1 read from the volatile storage area 1501, the controller 130 may dump whole data DUMP_DATA stored in the volatile storage area 1501 into a predetermined first location (not illustrated) in the non-volatile storage area 1502.

The controller 130 may determine whether or not an error occurs in data DATA2 read from the non-volatile storage area 1502 in a normal operation mode. When an error is determined to occur in data DATA2 read from the non-volatile storage area 1502, the controller 130 may copy the error-occurred data DATA2 stored in the non-volatile storage area 1502 into a predetermined second location (not illustrated) in the volatile storage area 1501 as an error data ER_DATA.

The controller 130 may control the volatile storage area 1501 to output the data DUMP_DATA or ER_DATA or control the non-volatile storage area 1502 to output the data DUMP_DATA or ER_DATA in order to analyze a status of the memory system 110 in an error analysis mode that the memory system 110 enters in response to a request provided from the host 102.

The controller 130 may provide the host 102 through the first host interface 1322 with the data DATA1, which is output from the volatile storage area 1501 in the normal operation mode, and with the data DUMP_DATA or ER_DATA, which is output from the volatile storage area 1501 in the error analysis mode. Also, the controller 130 may provide the host 102 through the second host interface 1324 with the data DATA2, which is output from the non-volatile storage area 1502 in the normal operation mode, and with the data DUMP_DATA or ER_DATA, which is output from the non-volatile storage area 1502 in the error analysis mode.

The clock generation unit 135 may generate a first clock 1ST_CLK having a relatively high frequency and a second clock 2ND_CLK having a relatively low frequency. That is, the first clock 1ST_CLK may have higher frequency than the second clock 2ND_CLK.

The first clock 1ST_CLK may be transferred to the first host interface 1322, which may increase transfer speed of the data DATA1 or DUMP_DATA or ER_DATA from the volatile storage area 1501 to the first host interface 1322 through a first path P1.

The second clock 2ND_CLK may be transferred to the second host interface 1324, which may decrease transfer speed of the data DATA2 or DUMP_DATA or ER_DATA from the non-volatile storage area 1502 to the second host interface 1324 through a second path P2.

That is, the clock generation unit 135 and the operation control unit 520 may operate such that the speed of the data DATA1 or DUMP_DATA or ER_DATA provided from the volatile storage area 1501 through the first host interface 1322 is faster than the speed of the data DATA2 or DUMP_DATA or ER_DATA provided from the non-volatile storage area 1502 through the second host interface 1324.

To summarize, the controller 130 may transfer the data DATA1 or DUMP_DATA or ER_DATA between the host 102 and the volatile storage area 1501 through the first host interface 1322 in response to the first clock 1ST_CLK, and may transfer the data DATA2 or DUMP_DATA or ER_DATA between the host 102 and the non-volatile storage area 1502 through the second host interface 1324 in response to the second clock 2ND_CLK. Since the first clock 1ST_CLK has a higher frequency than the second clock 2ND_CLK, the transfer speed of the data DATA1 or DUMP_DATA or ER_DATA from the volatile storage area 1501 through the first interface 1322 may be faster than the transfer speed of the data DATA2 or DUMP_DATA or ER_DATA from the non-volatile storage area 1502 through the second interface 1324.

Therefore, the controller 130 may transfer the data DATA1 or DUMP_DATA or ER_DATA between the host 102 and the volatile storage area 1501 with a relatively high speed, and may transfer the data DATA2 or DUMP_DATA or ER_DATA between the host 102 and the non-volatile storage area 1502 with a relatively low speed.

In an embodiment, the first host interface 1322 may be the dual in-line memory module (DIMM) interface and the second host interface 1324 may be the peripheral component interconnect express (PCI-e) interface.

In another embodiment, the first host interface 1322 may be the DIMM interface and the second host interface 1324 may be the DIMM interface.

In yet another embodiment, the first host interface 1322 may be the PCI-e interface and the second host interface 1324 may be the PCI-e interface.

In yet another embodiment, the first host interface 1322 may be the PCI-e interface and the second host interface 1324 may be the DIMM interface.

In an embodiment, the controller 130 may control the volatile storage area 1501 to operate as a main memory of the host 102. In an embodiment, the controller 130 may control the non-volatile storage area 1502 to operate as a storage device.

The error detection unit 510 may determine whether or not an error occurs in data DATA1 output from the volatile storage area 1501 and in data DATA2 output from the non-volatile storage area 1502 in the normal operation mode.

In the normal operation mode, the error detection unit 510 may detect an error in data DATA1 read from the volatile storage area 1501, and may determine whether or not to enable a first detection signal DET1 according to a result of detection.

In the normal operation mode, the error detection unit 510 may detect an error in data DATA2 read from the non-volatile storage area 1502, and may determine whether or not to enable a second detection signal DET2 according to a result of detection.

Also, the operation control unit 520 included in the controller 130 may perform two operations.

A first operation of the operation control unit 520 may be an operation of transferring the data DATA1 or DATA2 or DUMP_DATA or ER_DATA from the memory device 150 to the host 102 through the first and second interfaces 1ST_I/F and 2ND_I/F. Particularly, in order to transfer the data DATA1 or DUMP_DATA or ER_DATA between the host 102 and the volatile storage area 1501 of the memory device 150 through the first interface 1ST_I/F, the operation control unit 520 may transfer the data DATA1 or DUMP_DATA or ER_DATA between the volatile storage area 1501 of the memory device 150 and the first host interface 1322 through the first path P1. Further, in order to transfer the data DATA2 or DUMP_DATA or ER_DATA between the host 102 and the non-volatile storage area 1502 of the memory device 150 through the second interface 2ND_I/F, the operation control unit 520 may transfer the data DATA2 or DUMP_DATA or ER_DATA between the non-volatile storage area 1502 of the memory device 150 and the second host interface 1324 through the second path P2.

The operation control unit 520 may generate an internal command IN_CMD in response to an external command provided from the host 102, and may control the memory device 150 by using the internal command IN_CMD. At this time, each of the internal command IN_CMD and the external command OUT_CMD may include control information (not illustrated) and address information (not illustrated). Therefore, the operation control unit 520 may identify when the data DATA1 or DATA2 or DUMP_DATA or ER_DATA is output from the memory device 150, may select one of the first and second paths P1 and P2 by determining whether the data DATA1 or DATA2 or DUMP_DATA or ER_DATA output from the memory device 150 is the data DATA1 or DUMP_DATA or ER_DATA output from the volatile storage area 1501 or data DATA2 or DUMP_DATA or ER_DATA output from the non-volatile storage area 1502, and may transfer the data DATA1 or DATA2 or DUMP_DATA or ER_DATA through the selected one between the first and second paths P1 and P2.

A second operation of the operation control unit 520 may include an operation of dumping the volatile storage area 1501 into the predetermined first location in the non-volatile storage area 1502 and an operation of copying the error data ER_DATA into a predetermined first location in the volatile storage area 1501 in response to the detection signals DET<1:2> provided from the error detection unit 510.

The operation control unit 520 may also perform an operation of dumping the whole data of the volatile storage area 1501 into the predetermined first location in the non-volatile storage area 1502 by providing a dump operation signal DUMPEX to the memory device 150 in response to the first detection signal DET1 provided from the error detection unit 510. That is, the controller 130 may determine whether or not an error occurs in data DATA1 read from the volatile storage area 1501, may enable the first detection signal DET1 when an error is determined to occur in data DATA1 read from the volatile storage area 1501 through the error detection unit 510, may provide the dump operation signal DUMPEX to the memory device 150 in response to the first detection signal DET1 provided from the error detection unit 510 through the operation control unit 520. The memory device 150 may dump the whole data of the volatile storage area 1501 into the predetermined first location in the non-volatile storage area 1502 in response to the dump operation signal DUMPEX.

During the dump operation, the whole data DUMP_DATA of the volatile storage area 1501 may be moved into the non-volatile storage area 1502 without modification.

The operation control unit 520 may perform an operation of copying the data DATA2, in which an error occurs in the non-volatile storage area 1502, into the predetermined second location in the volatile storage area 1501 as an error data ER_DATA by providing a copy operation signal ECOPY to the memory device 150 in response to the second detection signal DET2 provided from the error detection unit 510. That is, the controller 130 may determine whether or not an error occurs in data DATA2 read from the non-volatile storage area 1502, may enable the second detection signal DET2 when an error is determined to occur in data DATA2 read from the non-volatile storage area 1502 through the error detection unit 510, may provide the copy operation signal ECOPY to the memory device 150 in response to the second detection signal DET2 provided from the error detection unit 510 through the operation control unit 520. The memory device 150 may copy the data DATA2, in which an error occurs in the non-volatile storage area 1502, into the predetermined second location in the volatile storage area 1501 as the error data ER_DATA in response to the copy operation signal ECOPY.

During the copy operation, the data DATA2 including the error may be copied into the predetermined second location in the volatile storage area 1501 without modification.

For the copy operation of the data DATA2, a storage size of the predetermined second location in the volatile storage area 1501 may be the same as a size of a single data-transfer from the non-volatile storage area 1502.

For example, when a size of a single data-transfer from the non-volatile storage area 1502 is 16 Mbyte, the predetermined second location having a size of 16 Mbyte may be allocated in the volatile memory dies V_DIE<1:2>.

The first and second operations of the operation control unit 520 may be performed totally independently from each other.

That is, an error of data DATA1 read from the volatile storage area 1501 and data DATA2 read from the non-volatile storage area 1502 may be or may not be error-corrected by an error-correction circuit such as the ECC unit 138 and accordingly the controller 130 may output the error-corrected data or a read fail signal as a status signal to the host 102 depending on a result of the error correction operation of the error-correction circuit. As such, the error-correction operation and the status management operation may be performed during process of providing data DATA1 and DATA2 from the memory device 150 to the host 102 through the operation control unit 520 in response to a request provided from the host 102.

On the other hand, the second operation of the error detection unit 510 and the operation control unit 520 may be performed in the memory system 110 despite a request provided from the host 102 when the error detection unit 510 detects an error in data DATA1 and DATA2 read from the memory device 150.

For reference, the error-detection operation of the error detection unit 510 may be regarded as the same as the error-detection operation of the operation control unit 520 since the error detection unit 510 performs the error-detection operation as the ECC unit 138. However, those error-detection operations may be different from each other because the error-detection operation of the error detection unit 510 is to output the detection signals DET<1:2> to the operation control unit 520 while the error-detection operation of the operation control unit 520 is to output the data DATA1 and DATA2 to the host 102.

The results of the dump operation and copy operation may be used to analyze a status of the memory system 110 in the error analysis mode.

The host 102 may provide an error analysis mode entering signal ER_ANAL to the operation control unit 520. The operation control unit 520 may control the memory system 110 to enter the error analysis mode in response to the error analysis mode entering signal ER_ANAL.

In an embodiment, in the error analysis mode, the data DUMP_DATA stored in the predetermined first location in the non-volatile storage area 1502 may be provided to the host 102. To this end, the host 102 may request the data DUMP_DATA to the operation control unit 520 through an external command OUT_CMD, the operation control unit 520 may provide an error analysis mode output signal ER_OUT to the memory device 150, and the memory device 150 may output the data DUMP_DATA stored in the predetermined first location of the non-volatile storage area 1502 to the host 102 through the operation control unit 520.

Therefore, the host 102 may receive and check the whole data DUMP_DATA stored in the volatile storage area 1501 at the time point when an error is determined to occur in data DATA1 read from the volatile storage area 1501 in the normal operation mode before the error analysis mode.

In an embodiment of the error analysis mode, the data DUMP_DATA stored in the predetermined first location in the non-volatile storage area 1502 may be dumped again into the volatile storage area 1501 and then the re-dumped data DUMP_DATA of the volatile storage area 1501 may be provided to the host 102. To this end, the host 102 may request the data DUMP_DATA to the operation control unit 520 through an external command OUT_CMD, the operation control unit 520 may provide an error analysis mode output signal ER_OUT and the dump operation signal DUMPEX to the memory device 150, and the memory device 150 may dump the data DUMP_DATA stored in the predetermined first location in the non-volatile storage area 1502 again into the volatile storage area 1501 and then may provide the re-dumped data DUMP_DATA of the volatile storage area 1501 to the host 102 through the operation control unit 520.

Therefore, the host 102 may receive and check the whole data DUMP_DATA stored in the volatile storage area 1501 at the time point when an error is determined to occur in data DATA1 read from the volatile storage area 1501 in the normal operation mode before the error analysis mode.

The host 102 may request the data DUMP_DATA to the operation control unit 520 in the case where relatively much time has passed from the time point when an error is determined to occur in data DATA1 read from the volatile storage area 1501 in the normal operation mode and/or the case where the memory system 110 is powered off and then powered on after an error is determined to occur in data DATA1 read from the volatile storage area 1501 in the normal operation mode.

In an embodiment of the error analysis mode, the data DUMP_DATA stored in the volatile storage area 1501 may be provided to the host 102.

This embodiment has an assumption that the DUMP_DATA is still stored in the volatile storage area 1501 in the error analysis mode. To this end, the host 102 may request the data DUMP_DATA to the operation control unit 520 through an external command OUT_CMD, the operation control unit 520 may provide an error analysis mode output signal ER_OUT to the memory device 150, and the memory device 150 may output the data DUMP_DATA stored in the volatile storage area 1501 to the host 102 through the operation control unit 520.

Even after completion of this embodiment, the data DUMP_DATA dumped into the predetermined first location in the non-volatile storage area 1502 may still remain. Therefore, the data DUMP_DATA stored in the predetermined first location in the non-volatile storage area 1502 may be provided to the host 102.

The host 102 may request the data DUMP_DATA to the operation control unit 520 in the case where relatively short time has passed from the time point when an error is determined to occur in data DATA1 read from the volatile storage area 1501 in the normal operation mode and/or the case where the memory system 110 is not powered off after an error is determined to occur in data DATA1 read from the volatile storage area 1501 in the normal operation mode.

The host 102 may analyze the error included in the provided whole data DUMP_DATA of the normal operation mode before the error analysis mode.

In an embodiment of the error analysis mode, the data ER_DATA stored in the predetermined second location in the volatile storage area 1501 may be provided to the host 102. To this end, the host 102 may request the data ER_DATA to the operation control unit 520 through an external command OUT_CMD, the operation control unit 520 may provide an error analysis mode output signal ER_OUT to the memory device 150, and the memory device 150 may output the data ER_DATA stored in the predetermined second location of the volatile storage area 1501 to the host 102 through the operation control unit 520.

Therefore, the host 102 may receive and check the data ER_DATA copied in the volatile storage area 1501 at the time point when an error is determined to occur in data DATA2 read from the non-volatile storage area 1502 in the normal operation mode before the error analysis mode.

In an embodiment of the error analysis mode, the data ER_DATA stored in the predetermined second location in the volatile storage area 1501 may be copied again into a predetermined third location of the non-volatile storage area 1502 and then the re-copied data ER_DATA of the predetermined third location in the non-volatile storage area 1502 may be provided to the host 102. To this end, the host 102 may request the data ER_DATA to the operation control unit 520 through an external command OUT_CMD, the operation control unit 520 may provide an error analysis mode output signal ER_OUT and the copy operation signal ECOPY to the memory device 150, and the memory device 150 may copy the data ER_DATA stored in the predetermined second location of the volatile storage area 1501 again into the predetermined third location of the non-volatile storage area 1502 and then may provide the re-copied data ER_DATA of the predetermined third location in the non-volatile storage area 1502 to the host 102 through the operation control unit 520.

Therefore, the host 102 may receive and check the data ER_DATA copied in the volatile storage area 1501 at the time point when an error is determined to occur in data DATA2 read from the non-volatile storage area 1502 in the normal operation mode before the error analysis mode.

Figure 5B:
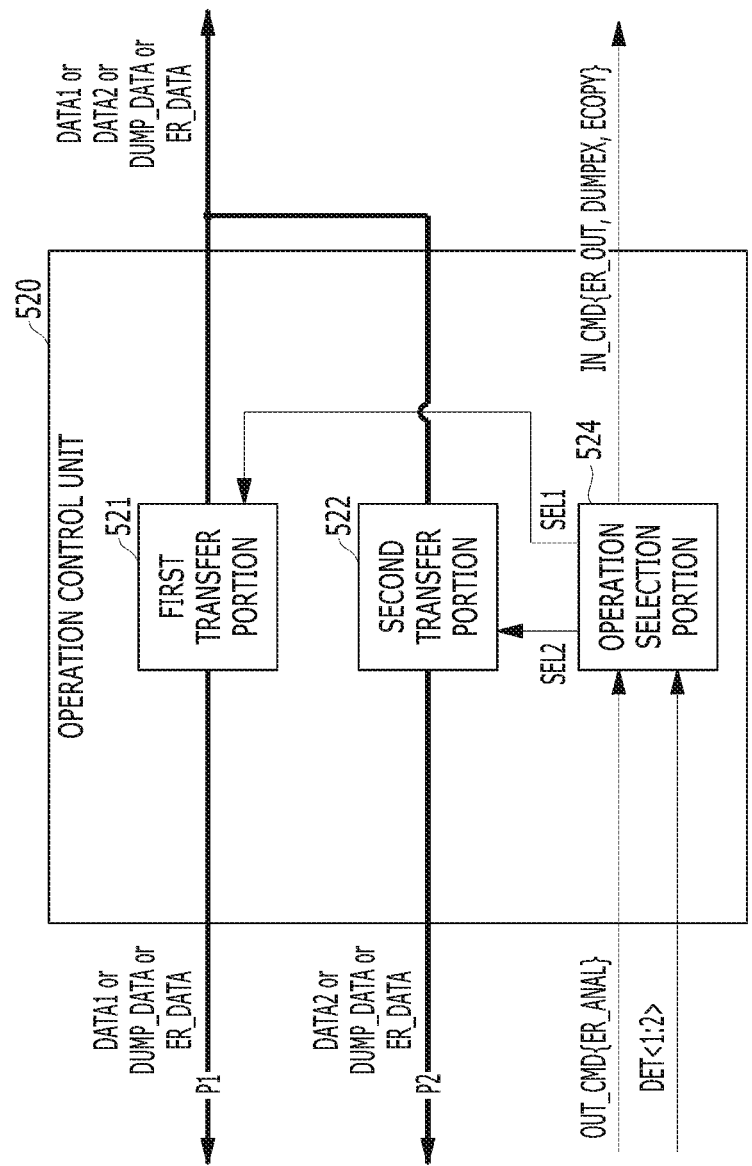
FIG. 5B is a block diagram illustrating detailed configuration of an operation control unit among the elements of the memory system in accordance with an embodiment of the present invention.

FIG. 5B is a block diagram illustrating detailed configuration of the operation control unit 520 of FIG. 5A.

Referring to FIG. 5B, the operation control unit 520 may include a first transfer portion 521, a second transfer portion 522, and an operation selection portion 524.

The first transfer portion 521 may output the data DATA1, DUMP_DATA, or ER_DATA provided from the memory device 150 to the first path P1 during enabled section of a first selection signal SEL1.

The second transfer portion 522 may output the data DATA2, DUMP_DATA or ER_DATA provided from the memory device 150 to the second path P2 during enabled section of a second selection signal SEL2.

The operation selection portion 524 may generate a command IN_CMD for controlling the memory device 150 and the first and second selection signals SEL1 and SEL2 for controlling the first and second transfer portions 521 and 522 in response to an external command OUT_CMD provided from the host 102 and the detection signals DET<1:2> provided from the error detection unit 510.

In response to an external command OUT_CMD provided from the host 102 and the detection signals DET<1:2> provided from the error detection unit 510, the operation selection portion 524 may identify when the data DATA1 or DATA2 or DUMP_DATA or ER_DATA is output from the memory device 150, and may identify whether the data DATA1 or DATA2 or DUMP_DATA or ER_DATA output from the memory device 150 is the data DATA1 or DATA2 or DUMP_DATA or ER_DATA output from the volatile storage area 1501 or the data DATA1 or DATA2 or DUMP_DATA or ER_DATA output from the non-volatile storage area 1502. Therefore, the operation selection portion 524 may properly enable the first and second selection signals SEL1 and SEL2 to control the first and second transfer portions 521 and 522.

In order to output the data DUMP_DATA stored in the predetermined first location of the non-volatile storage area 1502 through the second path P2 in the error analysis mode in response to an external command OUT_CMD, the operation selection portion 524 may provide the memory device 150 with the error analysis mode output signal ER_OUT and then may output the data DUMP_DATA by enabling the second selection signal SEL2 at a time point when the data DUMP_DATA stored in the predetermined first location of the non-volatile storage area 1502 is output to the second transfer portion 522.

In the similar way, in order to output the re-dumped data DUMP_DATA through the first path P1 in the error analysis mode in response to an external command OUT_CMD, the operation selection portion 524 may provide the memory device 150 with the error analysis mode output signal ER_OUT and the dump operation signal DUMPEX and then may output the data DUMP_DATA by enabling the first selection signal SEL1 at a time point when the re-dumped data DUMP_DATA is output to the first transfer portion 521.

Figure 6:
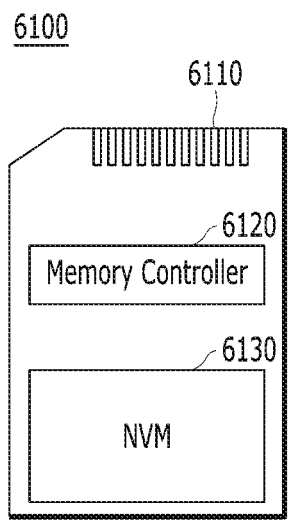
FIGS. 6 to 14 are diagrams schematically illustrating application examples of the data processing system of FIG. 1, in accordance with various embodiment of the present invention.

FIG. 6 is a diagram schematically illustrating another example of the data processing system including the memory system in accordance with an embodiment. FIG. 6 schematically illustrates a memory card system to which the memory system in accordance with an embodiment is applied.

Referring to FIG. 6, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 to 5B, and the memory device 6130 may correspond to the memory device 150 of the memory system 110 described with reference to FIGS. 1 to 5B.

Thus, the memory controller 6120 may include a RAM, a processing unit, a host interface, a memory interface and an error correction unit.

The memory controller 6120 may communicate with an external device, for example, the host 102 of FIG. 1 through the connector 6110. For example, as described with reference to FIGS. 1 to 5B, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with an embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may construct a solid-state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 7:
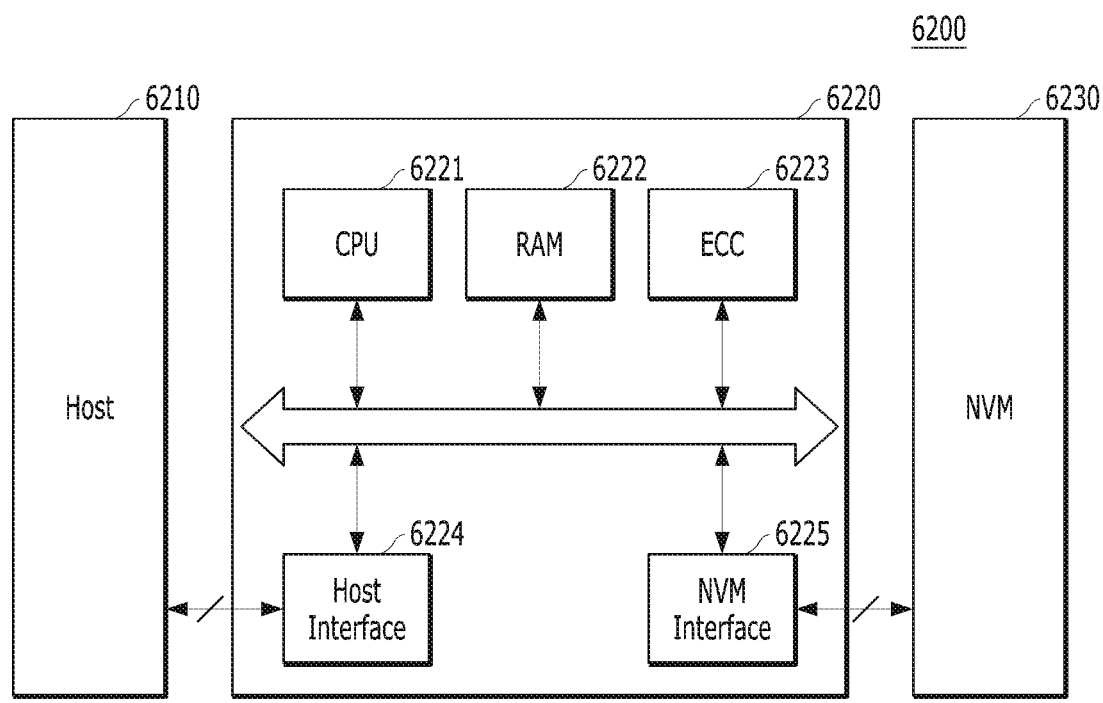

FIG. 7 is a diagram schematically illustrating another example of the data processing system including the memory system in accordance with an embodiment.

Referring to FIG. 7, the data processing system 6200 may include a memory device 6230 having one or more nonvolatile memories and a memory controller 6220 for controlling the memory device 6230. The data processing system 6200 illustrated in FIG. 7 may serve as a storage medium such as a memory card (CF, SD, micro-SD or the like) or USB device, as described with reference to FIGS. 1 to 5B. The memory device 6230 may correspond to the memory device 150 in the memory system 110 illustrated in FIGS. 1 to 5B, and the memory controller 6220 may correspond to the controller 130 in the memory system 110 illustrated in FIGS. 1 to 5B.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIGS. 1 to 5B. As described with reference to FIGS. 1 to 5B, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIGS. 1 to 5B, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with an embodiment may be applied to wired/wireless electronic devices or particularly a mobile electronic device.

Figure 8:
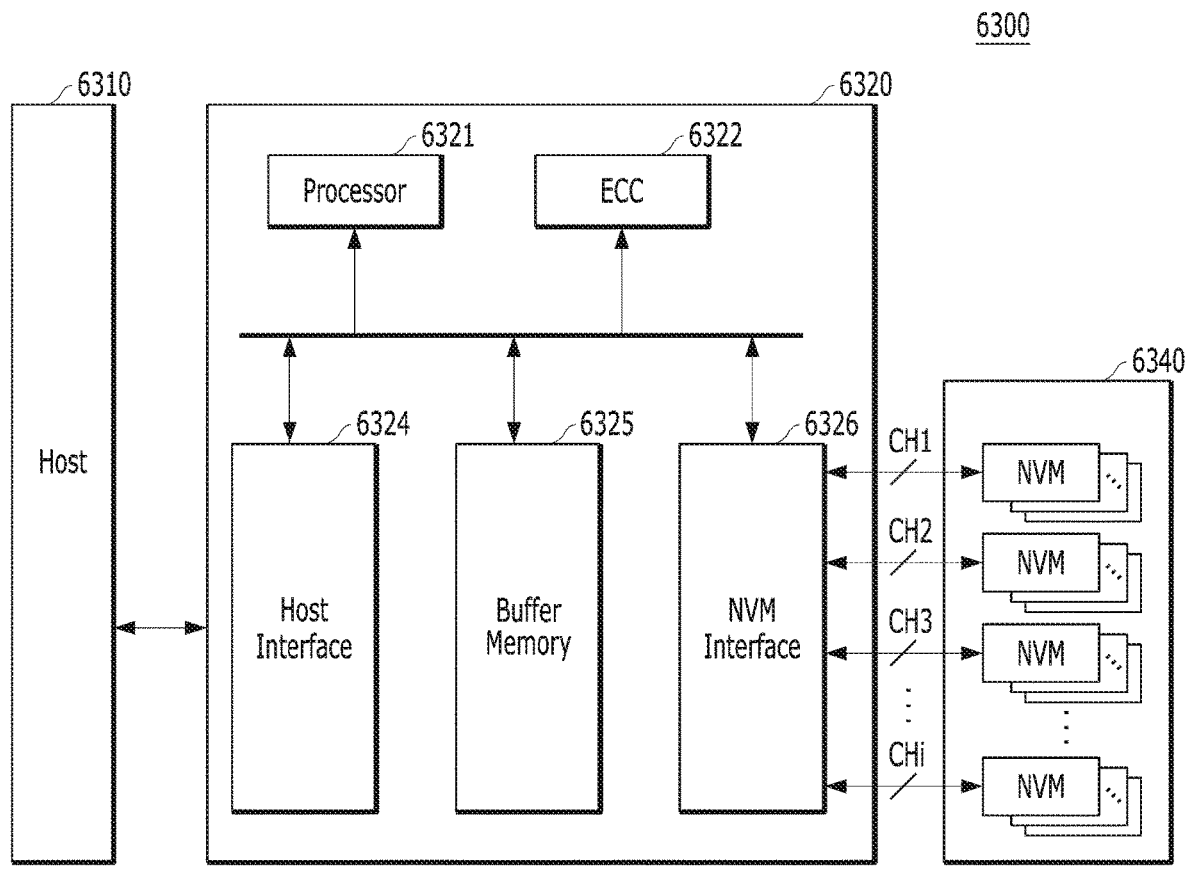

FIG. 8 is a diagram schematically illustrating another example of the data processing system including the memory system in accordance with an embodiment. FIG. 8 schematically illustrates an SSD to which the memory system in accordance with an embodiment is applied.

Referring to FIG. 8, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 8 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 9:
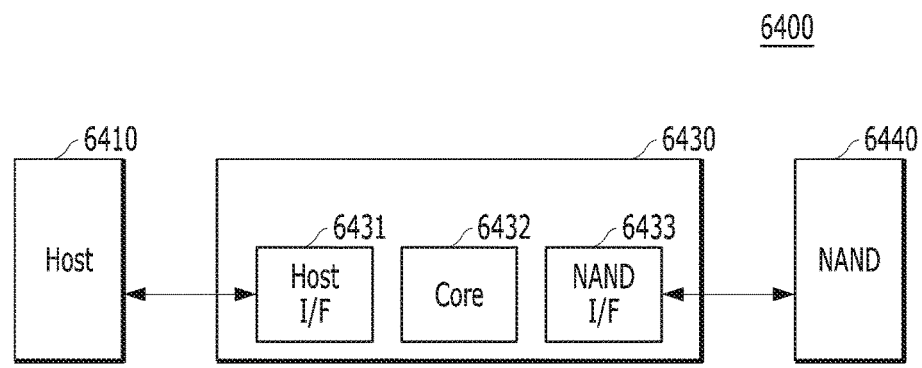

FIG. 9 is a diagram schematically illustrating another example of the data processing system including the memory system in accordance with an embodiment. FIG. 9 schematically illustrates an embedded Multi-Media Card (eMMC) to which the memory system in accordance with an embodiment is applied.

Referring to FIG. 9, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIGS. 1 to 5B. Furthermore, the host interface 6431 may serve as a serial interface, for example, UHS ((Ultra High Speed)-I/UHS-II) interface.

FIGS. 10 to 13 are diagrams schematically illustrating other examples of the data processing system including the memory system in accordance with an embodiment. FIGS. 10 to 13 schematically illustrate UFS (Universal Flash Storage) systems to which the memory system in accordance with an embodiment is applied.

Referring to FIGS. 10 to 13, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIGS. 1 to 5B. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 10 to 12, and the UFS cards 6530, 6630, 6730 and 6830 may be embodied in the form of the memory card system 6100 described with reference to FIG. 6.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 10:
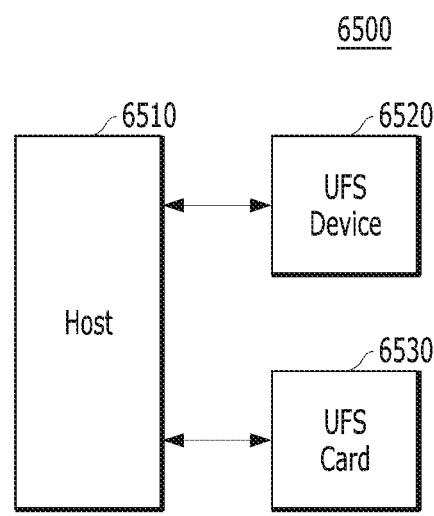

In the UFS system 6500 illustrated in FIG. 10, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In an embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 11:
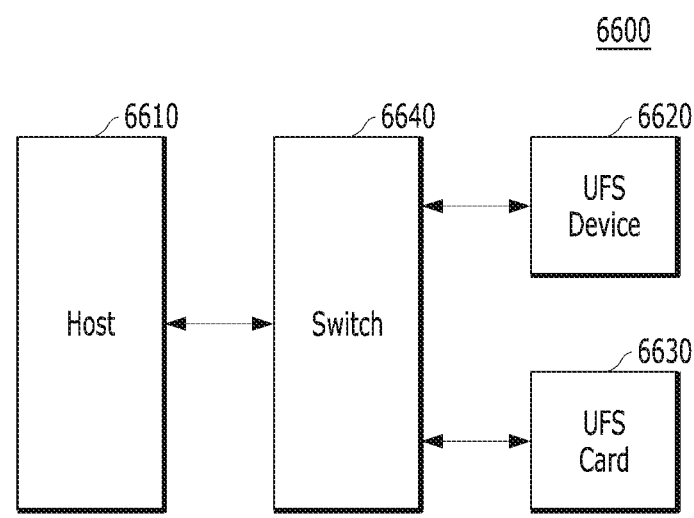

In the UFS system 6600 illustrated in FIG. 11, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In an embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 12:
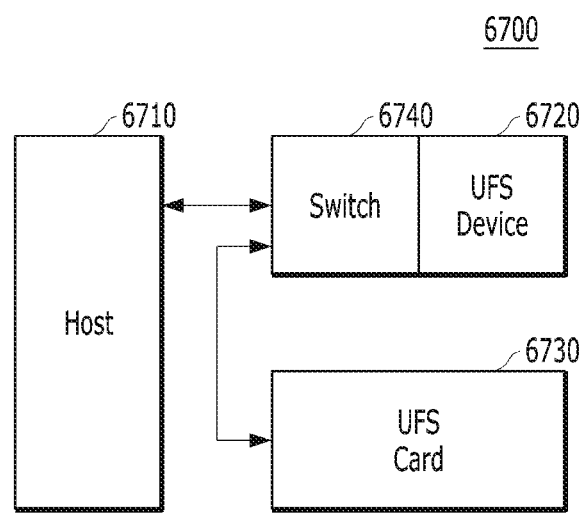

In the UFS system 6700 illustrated in FIG. 12, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In an embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 13:
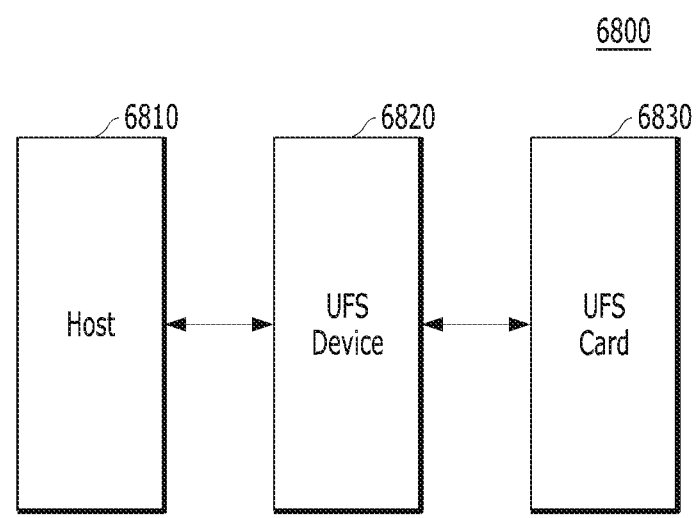

In the UFS system 6800 illustrated in FIG. 13, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In an embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 14:
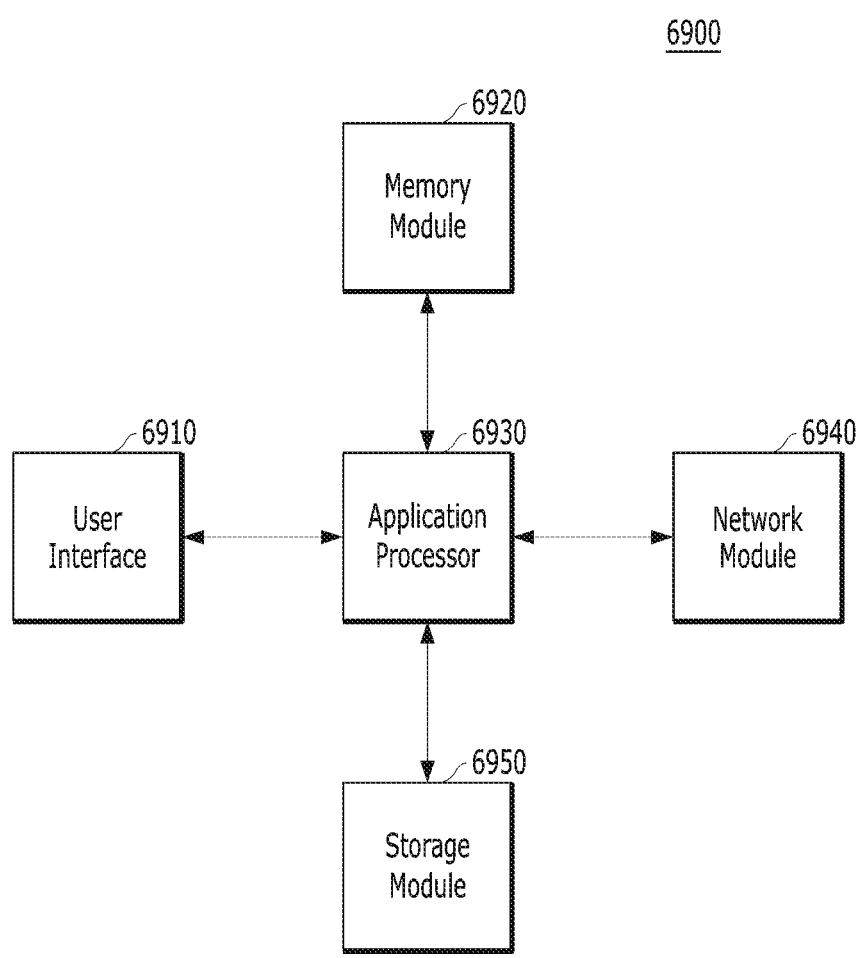

FIG. 14 is a diagram schematically illustrating another example of the data processing system including the memory system in accordance with an embodiment. FIG. 14 is a diagram schematically illustrating a user system to which the memory system in accordance with an embodiment is applied.

Referring to FIG. 14, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system in accordance with an embodiment of the present invention can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 to 5B. Furthermore, the storage module 6950 may be embodied as an SSD, eMMC and UFS as described above with reference to FIGS. 8 to 13.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

According to the embodiments of the present invention, the memory system and the method for operating the memory system may be able to minimize the complexity and performance deterioration of the memory system, maximize the usage efficiency of a memory device, and rapidly and stably process data into a memory device.

While the present invention has been described with respect to the specific embodiments, it will be apparent to those skilled in the art that various changes and modifications may be made without departing from the spirit and scope of the invention as defined in the following claims.

What is claimed is:

1. A memory system comprising:
    a memory device including a volatile storage area and a non-volatile storage area; and
    a controller including first and second interfaces for transferring data between the memory system and a host, and suitable for transferring data between the volatile storage area and the host through the first interface and transferring data between the non-volatile storage area and the host through the second interface,
    wherein the controller is further suitable for determining whether or not an error occurs in data read from the volatile storage area in a normal operation mode, and dumping a whole data of the volatile storage area into a predetermined first location of the non-volatile storage area when an error is determined to occur in the data read from the volatile storage area.

2. The memory system of claim 1, wherein the controller is further suitable for determining whether or not an error occurs in data read from the non-volatile storage area in the normal operation mode, and copying the data including the error into a predetermined second location of the volatile storage area when the error is determined to occur in the data read from the non-volatile storage area.

3. The memory system of claim 2, wherein the controller includes:
    an error detection unit suitable for detecting whether or not an error occurs in data read from the non-volatile storage area and data read from the volatile storage area in the normal operation mode; and
    an operation control unit suitable for dumping the whole data of the volatile storage area into the predetermined first location of the non-volatile storage area or copying the data including the error into the predetermined second location of the volatile storage area in response to a detection signal provided from the error detection unit.

4. The memory system of claim 3,
    wherein the operation control unit is further suitable for letting the memory system enter an error analysis mode in response to a request provided from the host after the dumping of the whole data of the volatile storage area into the predetermined first location of the non-volatile storage area, and
    wherein the operation control unit is further suitable for letting the memory system enter the error analysis mode in response to a request provided from the host after the copying of the data including the error into the predetermined second location of the volatile storage area.

5. The memory system of claim 4, wherein the operation control unit is further suitable for, in response to a request provided from the host, in the error analysis mode:
    outputting the data of the predetermined first location to the host through the second interface; or
    dumping a whole data of the predetermined first location into the volatile storage area, and outputting a whole data of the volatile storage area to the host through the first interface; or
    outputting a whole data of the volatile storage area to the host through the first interface.

6. The memory system of claim 4, wherein the operation control unit is further suitable for, in response to a request provided from the host, in the error analysis mode:
    outputting the data of the predetermined second location to the host through the first interface; or
    copying the data of the predetermined second location into a predetermined third location of the non-volatile storage area and outputting the data of the predetermined third location to the host through the second interface.

7. The memory system of claim 3, wherein the controller further includes:
    a clock generation unit suitable for generating a first clock having a relatively high frequency and a second clock having a relatively low frequency; and the operation control unit suitable for transferring data between the volatile storage area and the host through the first interface, which is operative in response to the first clock, and transferring data between the non-volatile storage area and the host through the second interface, which is operative in response to the second clock.

8. The memory system of claim 7,
wherein the volatile storage area is a main memory of the host, and
wherein the non-volatile storage area is a storage of the host.

9. The memory system of claim 2,
wherein a size of the non-volatile storage area is greater than a size of the volatile storage area,
wherein a size of the predetermined first location is the same as the size of the volatile storage area, and
wherein a size of the predetermined second location is the same as a maximum size of data transferred to and/or from the non-volatile storage area at one time.

10. The memory system of claim 1,
wherein the first interface is an interface between either a dual in-line memory module (DIMM) interface or a peripheral component interconnect express (PCI-e) interface, and
wherein the second interface is an interface between either a dual in-line memory module (DIMM) interface or a peripheral component interconnect express (PCI-e) interface.

11. The memory system of claim 1, wherein the memory device includes a plurality of volatile memory dies corresponding to the volatile storage area, and a plurality of non-volatile memory dies corresponding to the non-volatile storage area.

12. An operating method of a memory system including a memory device including a volatile storage area and a non-volatile storage area and first and second interfaces for transferring data between the memory system and a host, the operating method comprising:
transferring data between the volatile storage area and the host through the first interface and transferring data between the non-volatile storage area and the host through the second interface; and
determining whether or not an error occurs in data read from the volatile storage area in a normal operation mode, and dumping a whole data of the volatile storage area into a predetermined first location of the non-volatile storage area when an error is determined to occur in data read from the volatile storage area.

13. The operating method of claim 12, further comprising determining whether or not an error occurs in data read from the non-volatile storage area in the normal operation mode, and copying the data including the error into a predetermined second location of the volatile storage area when the error is determined to occur in the data read from the non-volatile storage area.

14. The operating method of claim 13, further comprising:
letting the memory system enter an error analysis mode in response to a request provided from the host after the dumping of the whole data of the volatile storage area into the predetermined first location of the non-volatile storage area; and
letting the memory system enter the error analysis mode in response to a request provided from the host after the copying of the data including the error into the predetermined second location of the volatile storage area.

15. The operating method of claim 14, further comprising, in the error analysis mode:
outputting the data of the predetermined first location to the host through the second interface; or
dumping a whole data of the predetermined first location into the volatile storage area, and outputting a whole data of data of the volatile storage area to the host through the first interface; or
outputting a whole data of data of the volatile storage area to the host through the first interface.

16. The operating method of claim 14, further comprising, in the error analysis mode:
outputting the data of the predetermined second location to the host through the first interface; or
copying the data of the predetermined second location into a predetermined third location of the non-volatile storage area and outputting the data of the predetermined third location to the host through the second interface.

17. The operating method of claim 13,
wherein a size of the non-volatile storage area is greater than a size of the volatile storage area,
wherein a size of the predetermined first location is the same as the size of the volatile storage area, and
wherein a size of the predetermined second location is the same as a maximum size of data transferred to and/or from the non-volatile storage area at one time.

18. The operating method of claim 12, wherein the transferring of the data includes:
generating a first clock having a relatively high frequency and a second clock having a relatively low frequency; and
transferring data between the volatile storage area and the host through the first interface, which is operative in response to the first clock; and
transferring data between the non-volatile storage area and the host through the second interface, which is operative in response to the second clock.

19. The operating method of claim 12,
wherein the volatile storage area is a main memory of the host, and
wherein the non-volatile storage area is a storage of the host.

20. The operating method of claim 12,
wherein the first interface is an interface between either a dual in-line memory module (DIMM) interface or a peripheral component interconnect express (PCI-e) interface, and
wherein the second interface is an interface between either a dual in-line memory module (DIMM) interface or a peripheral component interconnect express (PCI-e) interface.

21. A memory system comprising:
a memory device including first and second memories; and
a controller suitable for transferring data from the first memory to an external through a first path with a greater speed, transferring data from the second memory to the external through a second path with a slower speed, and controlling the memory device:
to dump, when detecting first data including an error from the first memory, whole data stored in the first memory into the second memory; and
to copy, when detecting second data including an error from the second memory, the second data into the first memory.

* * * * *